(12) United States Patent
Haiberger et al.

(10) Patent No.: US 11,239,396 B2
(45) Date of Patent: Feb. 1, 2022

(54) LIGHT EMITTING DEVICE AND METHOD FOR MANUFACTURING A LIGHT EMITTING DEVICE

(71) Applicant: OSRAM OLED GmbH, Regensburg (DE)

(72) Inventors: Luca Haiberger, Regensburg (DE); Sam Chou, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 36 days.

(21) Appl. No.: 16/635,470

(22) PCT Filed: Aug. 8, 2018

(86) PCT No.: PCT/EP2018/071512
§ 371 (c)(1),
(2) Date: Jan. 30, 2020

(87) PCT Pub. No.: WO2019/048170
PCT Pub. Date: Mar. 14, 2019

(65) Prior Publication Data
US 2020/0259052 A1    Aug. 13, 2020

(30) Foreign Application Priority Data

Sep. 5, 2017 (DE) .......................... 102017120385.0

(51) Int. Cl.
*H01L 33/50* (2010.01)
*H01L 33/00* (2010.01)
*H01L 33/58* (2010.01)
*H01L 33/60* (2010.01)

(52) U.S. Cl.
CPC ........ *H01L 33/505* (2013.01); *H01L 33/0095* (2013.01); *H01L 33/58* (2013.01); *H01L 33/60* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| 10,256,380 B2 | 4/2019 | Moench et al. |
| 2008/0179621 A1 | 7/2008 | Oppermann et al. |

(Continued)

FOREIGN PATENT DOCUMENTS

| DE | 102011118290 A1 | 5/2013 |
| DE | 102014112540 A1 | 3/2016 |

(Continued)

*Primary Examiner* — Bo B Jang
(74) *Attorney, Agent, or Firm* — Slater Matsil, LLP

(57) ABSTRACT

A light-emitting device and a method for manufacturing a light-emitting device are disclosed. In an embodiment a light-emitting device includes a light-emitting semiconductor chip with a light-outcoupling surface surrounded laterally by a first reflective material in a form-locking manner, a foil element on the light-outcoupling surface, an optical element on the foil element laterally surrounded by a second reflective material in a form-locking manner and a gas-filled gap located at least in a partial region between the foil element and the optical element.

20 Claims, 5 Drawing Sheets

(56) References Cited

U.S. PATENT DOCUMENTS

| | | | |
|---|---|---|---|
| 2009/0194776 A1* | 8/2009 | Pachler | H01L 33/505 |
| | | | 257/98 |
| 2012/0001204 A1 | 1/2012 | Jagt | |
| 2014/0158982 A1 | 6/2014 | Park et al. | |
| 2016/0087174 A1 | 3/2016 | Bhat et al. | |
| 2017/0087262 A1 | 3/2017 | Toita et al. | |
| 2017/0155022 A1* | 6/2017 | Tomonari | H01L 33/30 |
| 2017/0288108 A1 | 10/2017 | Schumann et al. | |
| 2017/0365752 A1 | 12/2017 | Schwarz et al. | |
| 2019/0326490 A1* | 10/2019 | Haiberger | H01L 33/50 |

FOREIGN PATENT DOCUMENTS

| | | |
|---|---|---|
| DE | 102014116134 A1 | 5/2016 |
| DE | 102014117983 A1 | 6/2016 |
| DE | 102016203162 A1 | 8/2017 |
| EP | 3174110 A1 | 5/2017 |

* cited by examiner

LIGHT EMITTING DEVICE AND METHOD FOR MANUFACTURING A LIGHT EMITTING DEVICE

This patent application is a national phase filing under section 371 of PCT/EP2018/071512, filed Aug. 8, 2018, which claims the priority of German patent application 102017120385.0, filed Sep. 5, 2017, each of which is incorporated herein by reference in its entirety.

TECHNICAL FIELD

A light-emitting device and a method for manufacturing a light-emitting device are specified.

BACKGROUND

For many lighting applications light sources are necessary that have compact designs. This can be achieved by using light-emitting diode chips, for example. In particular, it can be desirable if such light sources have already integrated lenses, which should, however, be optically coupled to a light-emitting diode chip via an air gap without too much offset and without too much stray light emission in order to increase the optical efficiency. For surface mounting, surfaces suitable for pick-and-place mounting should also be available, especially in the region of the lens.

SUMMARY OF THE INVENTION

Embodiments provide a light-emitting device. Further embodiments provide a process for manufacturing a light-emitting device.

According to at least one embodiment, a light-emitting device comprises a light-emitting semiconductor chip. The light-emitting semiconductor chip comprises in particular a semiconductor layer sequence with an active region for the generation of light. In particular, the active area can have an active layer in which light is generated during operation. The semiconductor layer sequence can preferably be grown on a growth substrate by means of an epitaxy process, for example by metal-organic vapor phase epitaxy (MOVPE) or molecular beam epitaxy (MBE). The semiconductor layer sequence thus comprises semiconductor layers which are arranged one above the other along an arrangement direction given by the growth direction. Perpendicular to the arrangement direction, the layers of the semiconductor layer sequence each have a main extension plane. Directions parallel to the main extension plane of the semiconductor layers are referred to as lateral directions in the following.

In accordance with at least one further embodiment, at least one light-emitting semiconductor chip is provided in a method for manufacturing a light-emitting device. The features and embodiments described above and below apply equally to the light-emitting device and to the method for manufacturing the light-emitting device.

The light-emitting semiconductor chip has a light-outcoupling surface through which the light generated during operation of the light-emitting device is emitted. In particular, the light-outcoupling surface can be a main surface of the semiconductor chip, which is arranged perpendicular to the direction of growth of the semiconductor layer sequence. Furthermore, the semiconductor chip has a rear side opposite the light-outcoupling surface. The light-outcoupling surface and the rear side are connected to each other via side surfaces. In addition to the emission of light through the light-outcoupling surface, the light generated in the active layer during operation can also be emitted at least partially via the side surface and/or the rear side.

Depending on the light to be generated, the light-emitting semiconductor chip can have a semiconductor layer sequence based on different semiconductor material systems. For long-wave, infrared to red radiation for example, a semiconductor layer sequence based on $In_xGa_yAl_{1-x-y}As$ is suitable, for red to green radiation for example, a semiconductor layer sequence based on $In_xGa_yAl_{1-x-y}P$ is suitable, and for shorter-wave visible radiation, i.e., in particular for green to blue radiation, and/or for UV radiation a semiconductor layer sequence based on $In_xGa_yAl_{1-x-y}N$ is suitable, wherein $0 \leq x \leq 1$ and $0 \leq y \leq 1$ apply in each case.

The growth substrate can comprise or be an insulator material or a semiconductor material, for example, a compound semiconductor material system as mentioned above. In particular, the growing substrate can comprise or be made of sapphire, GaAs, GaP, GaN, InP, SiC, Si and/or Ge. The growth process can take place in particular in a wafer compound. In other words, a growth substrate is provided in the form of a wafer on which the semiconductor layer sequence is grown over a large area. The grown semiconductor layer sequence can be separated into individual semiconductor chips in a further process step, wherein the side surfaces of the semiconductor chips can be formed by the separation. Furthermore, the semiconductor layer sequence can be transferred to a carrier substrate and the growth substrate can be removed at least partially or completely.

The semiconductor layer sequence of the light-emitting semiconductor chip can have an active region for generating light, for example, a conventional pn-junction, a double heterostructure, a single quantum well structure (SQW structure) or a multiple quantum well structure (MQW structure). In addition to the active region, the semiconductor layer sequence can comprise other functional layers and functional regions, such as p- or n-doped charge carrier transport layers, undoped or p- or n-doped confinement, cladding or waveguide layers, barrier layers, planarization layers, buffer layers, protective layers and/or electrodes, as well as combinations thereof. In particular, for electrical contacting the light-emitting semiconductor chip can have electrical contacts, for example, in the form of electrode layers, on the rear side opposite the light-outcoupling surface. The light-emitting semiconductor chip can be embodied in particular as a so-called flip chip, which can be mounted and electrically contacted, with contacts arranged on a side facing away from a substrate, on a connection carrier such as a housing or a circuit board, so that the light-outcoupling surface, which can preferably be formed by a surface of the substrate facing away from the semiconductor layer sequence, is arranged facing away from the connection carrier. The structures described here concerning the light-emitting semiconductor chip are known to the expert in particular with regard to their design, function and structure and are therefore not explained in detail here.

According to a further embodiment, the light-emitting device has a first reflective material that surrounds the light-emitting semiconductor chip laterally in a form-locking manner. For this purpose, the first reflective material can form a molded body that covers the side surfaces of the semiconductor chip positively and directly. The first reflective material is formed in particular on the light-emitting semiconductor chip and encloses the light-emitting semiconductor chip on all sides in the lateral direction. In other words, the first reflective material can form a molded body which is arranged around the semiconductor chip when viewed in a plan view of the light-outcoupling surface of the semiconductor chip, and in particular is formed on all side surfaces of the light-emitting semiconductor chip. In particular, the first reflective material is embodied so that the light-outcoupling surface of the light-emitting semiconductor chip is not covered. The side surfaces of the light-emitting semiconductor chip can preferably be completely covered with the first reflective material, so that the molded body formed by the first reflective material has a top side that can be flush with the light-outcoupling surface. Furthermore, the rear side of the light-emitting semiconductor chip can also be at least partially free of the first reflective material; in particular, contacts for the electrical connection of the light-emitting semiconductor chip can be free on the rear side.

The first reflective material can in particular have a matrix material, preferably a plastic material such as silicone, epoxy or an epoxy silicone hybrid material. Furthermore, the first reflective material can have additives such as particles in the matrix material. For example, the first reflective material can comprise or be a silicone and/or epoxy filled with particles such as $TiO_2$ and/or $SiO_2$ particles. Due to the additives in the matrix material, the first reflective material is at least partially optically reflective for the light emitted by the semiconductor chip during operation. Light that emerges at the side surfaces of the light-emitting semiconductor chip can thus be at least partially reflected by the first reflective material. Furthermore, the first reflective material having side surfaces facing away from the semiconductor chip can form a mechanically stabilizing element that promotes or essentially causes the stability of the light-emitting device.

In particular, the first reflective material can be produced by a molding process, wherein here and in the following the term molding process can include processes such as casting, injection, pressing, laminating a film and the like. For example, the molded body can be formed by a transfer molding process, for example, a film injection molding process, or a compression molding process or by casting.

According to a further embodiment, the light-emitting device has a foil element on the light-emitting semiconductor chip. In particular, the foil element can be arranged directly on the light-outcoupling surface of the light-emitting semiconductor chip. It can be particularly advantageous here if the foil element adheres at least partially to the light-outcoupling surface by means of adhesive forces. The foil element can particularly preferably protrude laterally beyond the light-outcoupling surface and can also be applied directly to the first reflective material and preferably adhere to it at least partially. In particular, the foil element can extend laterally to the side surfaces of the first reflective material facing away from the light-emitting semiconductor chip.

According to a further embodiment, the foil element comprises a plastic material. In particular, the plastic material can be at least partially transparent to the light emitted by the semiconductor chip during operation, so that the foil element can accordingly be at least partially transparent. For example, the foil element can be optically clear and thus essentially completely transparent. The plastic material may, for example, contain siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. For example, the matrix material can comprise or be an epoxy resin, polymethyl methacrylate (PMMA), polystyrene, polycarbonate, polyacrylate, polyurethane or a silicone resin such as polysiloxane or mixtures thereof.

Furthermore, the foil element can also be embodied as a wavelength conversion element and can comprise at least one or more wavelength conversion materials which are suitable for converting the light emitted by the light-emitting semiconductor chip during operation at least partially into light with a different wavelength, so that the light-emitting device can emit a mixed light formed by the light primarily emitted by the semiconductor chip and the converted secondary light, or, in the case of a complete conversion of the light emitted by the semiconductor chip, essentially the converted light. For example, the wavelength conversion material or materials can include one or more of the following: garnets of rare earths and alkaline earth metals, nitrides, nitridosilicates, sions, sialons, aluminates, oxides, halophosphates, orthosilicates, sulphides, vanadates and chlorosilicates. Furthermore, the wavelength conversion material(s) can additionally or alternatively comprise an organic material which can be selected from a group comprising perylenes, benzopyrenes, coumarins, rhodamines and azo dyes. The wavelength conversion material(s) can be distributed homogeneously or for example, also in layers in the plastic material. Correspondingly, the foil element can also be multi-layered and may, for example, have one layer that comprises one or more wavelength conversion materials and another layer that is free of wavelength conversion materials.

According to a further embodiment, the light-emitting device has an optical element on the foil element. The optical element can, for example, be a lens element and have a top side, in which a lens structure is present, facing away from the light-emitting semiconductor chip. The optical element may, for example, comprise a glass and/or a plastic and can be particularly preferably optically clear. The optical element can particularly preferably be at least partially applied directly to the foil element. Here, the optical element can furthermore adhere to the foil element by means of adhesive forces.

According to a further embodiment, there is a gap between the foil element and the optical element at least in a partial region. In particular, the gap can be gas-filled, for example, air-filled. The foil element can have a top side facing away from the semiconductor chip and the optical element can have a bottom side facing the semiconductor chip, the top side of the foil element and the bottom side of the optical element being at least partially spaced apart from each other to form the gap. For this purpose, the optical element can preferably have a recess on the bottom side surrounded by a rim. The rim allows the optical element to rest on the foil element, especially in direct contact, while the recess forms the gap between the foil element and the optical element. In particular, the gap can also be free of any adhesives. The gas-filled gap can improve the light coupling from the foil element into the optical element.

According to a further embodiment, the optical element has a channel that connects the gap with an atmosphere surrounding the light-emitting device. The channel can therefore also be denoted as an air vent. Through the channel, a gas exchange between the environment and the gap can be ensured, so that the formation of a closed microclimate in the gap can be avoided.

According to a further embodiment, the light-emitting device has a second reflective material. The second reflective material can laterally surround the optical element in a form-locking manner. For this purpose, the second reflective material can form a molded body which covers the side surfaces of the optical element in a form-locking and direct manner. The second reflective material is in particular formed to the optical element and encloses the optical element on all sides in the lateral direction. In other words, the second reflective material can form a molded body which is arranged around the optical element in a plan view of the light-outcoupling surface of the semiconductor chip and thus also of the top surface of the optical element, and is molded in particular to all side surfaces of the optical element. The second reflective material, which can be applied directly to the foil element and which has side surfaces facing away from the optical element, can in particular also be embodied and provided for fixing the optical element to the foil element. Furthermore, the second reflective material can have features which are described above in connection with the first reflective material. The first and second reflective material can be the same or different.

According to a further embodiment, the optical element has a step in one or preferably in all of the side surfaces that delimit the optical element in the lateral direction and to which the second reflective material is molded. For example, the step can be covered by the second reflective material so that the step can act as an anchoring element. Furthermore, the step can also be embodied as a stop structure defining an upper edge up to which the second reflective material extends upwards as seen from the foil element.

In particular, for the manufacture of the light-emitting device a plurality of light-emitting semiconductor chips can be provided, which are together enveloped by molding with the first reflective material. For this purpose, the light-emitting semiconductor chips can be arranged on a temporary carrier. In particular, the light-emitting semiconductor chips can be embodied as flip chips and can be arranged on the carrier with the rear side provided with the contacts, so that the light-outcoupling surfaces of the light-emitting semiconductor chips are facing away from the temporary carrier. The temporary carrier can be, for example, a semiconductor, metal, plastic and/or ceramic carrier on which the light-emitting semiconductor chips are temporarily attached, i.e., they can be removed again without destruction. For example, an adhesive film can be applied to the temporary carrier for this purpose, to which the light-emitting semiconductor chips adhere for the following process steps. By laterally enveloping the light-emitting semiconductor chips with the first reflective material, in particular by means of one of the methods described above, the first reflective material can be laterally formed onto the light-emitting semiconductor chips so that the first reflective material surrounds each of the light-emitting semiconductor chips laterally in a form-locking manner. After application and curing, the first reflective material thus forms a continuous body on the temporary carrier in which the light-emitting semiconductor chips are arranged.

Subsequently, a continuous foil can be applied to the light-outcoupling surfaces of the light-emitting semiconductor chips so that the light-outcoupling surfaces are covered by the continuous foil together with the first reflective material. In particular, the continuous foil can form a compound of foil elements, so that later, after completion of the manufacturing process, a foil element is arranged on each light-outcoupling surface. The foil, which is embodied according to the above description for the foil element, can preferably not be fully cured during or after application. This means that the foil can be applied particularly preferred as a not completely cured foil and be sticky in this state. In this way, for example, it can be achieved that the foil and thus also the foil elements adhere to the light-outcoupling surfaces of the light-emitting semiconductor chips and also to the first light-reflecting material.

Furthermore, a plurality of optical elements can be applied to the foil. In particular, the foil in this process step can be in a not yet completely cured state as described above, so that the optical elements can adhere to the foil. In particular, the optical elements can be applied in such a way that exactly one optical element is assigned to exactly one light-emitting semiconductor chip. By using the foil described herein, it can be possible to attach the foil to the light-emitting semiconductor chips and the optical elements to the foil and thus to the foil elements, at least temporarily, without the need for using an additional adhesive.

Furthermore, the optical elements can be laterally enveloped with the second reflective material so that the second reflective material surrounds each of the optical elements laterally in a form-locking manner. The second reflective material can preferably be applied directly to the foil, wherein process steps can be used for this which are described above in connection with the first reflective material. Thus, after application and curing, the second reflective material can form a continuous body on the foil in which the optical elements are arranged. Together with the curing of the second reflective material, the foil can also be cured.

According to a further embodiment, for producing a plurality of singulated light-emitting devices a separation of the first and second reflective material is performed. In particular, in the step of separating the first and second reflecting material also the continuous foil can be separated for forming a plurality of foil elements. Particularly preferably, the separation can be performed in a common sawing step, since particularly in regard to the first and second reflecting material a same material can be separated. By the separation laterally delimiting side surfaces of the light-emitting device are formed. These can be formed by side surfaces of the reflecting first material, the foil element and the reflecting second material, which are formed by the separation, respectively.

In addition, further process steps can follow, such as thermal debonding of the light-emitting devices from the temporary carrier and/or re-lamination and plasma treatment steps such as plasma glazing. In addition, the devices can be tested and sorted in a foil composite and then arranged on tapes in the usual way ("taping").

The light-emitting device described here is characterized by a very compact design that can be produced in an efficient process. The light-emitting device can be particularly suitable for applications where small dimensions and compact shapes are advantageous. For example, the applications can be flash applications, especially in mobile phones, i.e., front and rear flash applications. Furthermore, the applications can be so-called wearable applications, i.e., applications in fitness trackers and similar bio-monitoring devices, as well as LCD backlight applications.

Due to the first and second reflective material a stabilizing housing body of the device can be formed, especially with a robust connection between the semiconductor chip and the optical element. On the other hand, it can be prevented that light can escape laterally, i.e., in a lateral direction, from the light-emitting semiconductor chip and the optical element. Furthermore, the device can be manufactured with side surfaces that are flat, especially in the region of the optical element, so that a pick-and-place process can be used. In addition, the fact that no additional adhesive is required to attach the optical element makes it easy to ensure that the gap between the foil element and the optical element remains adhesive-free, which can result in increased optical efficiency. In addition, correct alignment between the semiconductor chip and the optical element is easier to achieve because there is less risk of lateral misalignment of the optical element to the semiconductor chip.

BRIEF DESCRIPTION OF THE DRAWINGS

Further advantages, advantageous embodiments and further developments are revealed by the embodiments described below in connection with the figures, in which.

DETAILED DESCRIPTION OF ILLUSTRATIVE EMBODIMENTS

Figure 1:
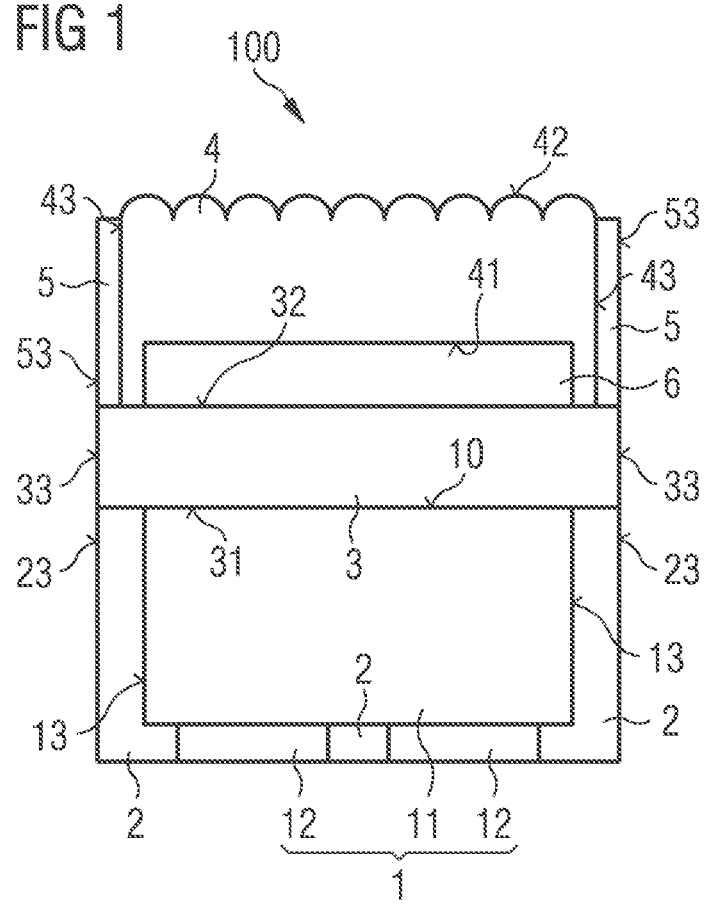
FIG. 1 shows a schematic illustration of a light-emitting device according to an embodiment.

In the embodiments and figures, identical, similar or identically acting elements are provided in each case with the same reference numerals. The elements illustrated and their size ratios to one another should not be regarded as being to scale, but rather individual elements, such as for example, layers, components, devices and regions, may have been made exaggeratedly large to illustrate them better and/or to aid comprehension.

FIG. 1 shows an embodiment of a light-emitting device 100, which comprises a light-emitting semiconductor chip 1. The light-emitting semiconductor chip 1 comprises a semiconductor body ii with a semiconductor layer sequence with an active region for generating light which can be emitted via a light-outcoupling surface 10. In addition, it can also be possible for light to be emitted during operation via the rear side opposite the light-outcoupling surface and/or via the side surfaces 13 that delimit the semiconductor chip 1 in the lateral direction. Depending on the light to be generated, the light-emitting semiconductor chip 1 can have a semiconductor layer sequence based on different semiconductor material systems, for example, based on InAlGaN, InAlGaP and/or InAlGaAs. The light-emitting semiconductor chip is embodied as a flip chip in the embodiment shown and has contacts 12 for mounting and electrical connection on the rear side opposite the light-outcoupling surface 10. The light-outcoupling surface 10 can, for example, be a surface of a substrate such as a sapphire substrate on which the semiconductor layer sequence is deposited. Alternatively, other chip embodiments are also possible.

The light-emitting device 100 also has a first reflective material 2, which surrounds the light-emitting semiconductor chip 1 in a form-locking manner in the lateral direction. For this purpose, the first reflective material 2 is embodied as a molded body which covers the side surfaces 13 of the semiconductor chip 1 positively and directly. The first reflective material 2 is formed in particular on the light-emitting semiconductor chip 1 and encloses the light-emitting semiconductor chip 1 on all sides in the lateral direction, the light-outcoupling surface 10 being free of the first reflective material 2. On the rear side opposite the light-outcoupling surface 10, as shown in FIG. 1, first reflective material 2 can also be present, wherein at least the contacts 12 are free from the first reflective material 2 in such a way that electrical connection and mounting of the light-emitting device 100 is possible. As shown, the side surfaces 13 of the light-emitting semiconductor chip 1 are preferably completely covered with the first reflective material 2, so that the molded body formed by the first reflective material 2 has a top side which is preferably flush with the light-outcoupling surface 10.

The first reflective material 2 comprises a matrix material, which in the embodiment shown can be silicone in particular. Furthermore, the first reflective material has 2 additives in the form of particles in the matrix material, by means of which the reflectivity of the first reflective material 2 can be affected or increased. In particular, the first reflective material 2 in the embodiment shown can be a silicone filled with $TiO_2$ particles.

Light which during operation of the light-emitting device 100 emerges at the side surfaces 13 and/or at the rear side of the light-emitting semiconductor chip 1 opposite the light-outcoupling surface 10 can be scattered and at least partially reflected by the first reflective material 2, so that scattered radiation emerging in the lateral direction can be reduced or completely prevented. For this purpose it can be particularly advantageous if the thickness of the first reflective material 2 in the lateral direction is greater than or equal to 200 µM.

Furthermore, the light-emitting device 100 comprises on the light-emitting semiconductor chip 1 a foil element 3, which is particularly preferably arranged directly on the light-outcoupling surface 10 of the light-emitting semiconductor chip 1. It can be particularly advantageous here if the foil element 3 adheres to the light-outcoupling surface 10 by means of adhesive forces. The foil element protrudes laterally beyond the light-outcoupling surface 10 and is thus also applied directly onto the first reflective material 2, so that the foil element 3 extends laterally to the side surfaces 23 of the first reflective material facing away from the light-emitting semiconductor chip 1. The foil element 3 has in lateral direction delimiting side surfaces 33, which together with the side surfaces 23 form a part of the lateral side surfaces of the light-emitting device 100.

The foil element 3 comprises a plastic material, for example, a silicone or an acrylate or any other material mentioned above in the general part. The plastic material is at least partially transparent to the light emitted by the semiconductor chip 1 generated in operation, so that the foil element 3 can accordingly be at least partially transparent. For example, the foil element 3 can be optically clear and thus essentially completely transparent, so that the light-emitting device 100 in operation essentially emits the light generated by the light-emitting semiconductor chip 1. Depending on the light colour of the light emitted by the semiconductor chip 1, such a configuration can be advantageous for wearable applications or backlighting applications, for example.

Furthermore, the foil element 3 can also be embodied as a wavelength conversion element and can comprise at least one or more wavelength conversion materials which are suitable for at least partially converting the light emitted by the light-emitting semiconductor chip 1 into light with a different wavelength. In this case, depending on the degree of conversion, the light-emitting device 100 can emit a mixed light, which can be composed of the light generated directly by the semiconductor chip 1 and the conversion light generated by the foil element 3 by converting part of this light. In the case of so-called full conversion, essentially all the light generated by the semiconductor chip 1 can also be converted by the foil element 3, so that in this case in operation essentially only conversion light is emitted by the light-emitting device 100. Configurations with a foil element 3 embodied as a wavelength conversion element can be advantageous for flash and backlight applications, for example. For example, the light-emitting semiconductor chip 1 can emit blue light, while the foil element 3 comprises at least one garnet such as yttrium alumina (YAG) and/or a nitride phosphor as a wavelength conversion material to convert a part of the blue light into yellow to green and/or red light, so that the light-emitting device 100 can emit white light as mixed light. Alternatively, other wavelength conversion materials mentioned in the general part as well as combinations thereof are possible.

The light-emitting device 100 furthermore has an optical element 4 on the foil element 3, which in the embodiment shown is formed as a lens element and which has a top side 42 with a lens structure, the top side facing away from the light-emitting semiconductor chip 1. The optical element 4, which can be in one or more parts, can, for example, comprise a glass and/or plastic and can be particularly preferred optically clear. The lens structure on the top side 42 can be a microlens array, for example. Furthermore, underneath the lens structure, for example, there can be a foil or a coating with openings assigned to the individual lens elements, which act as apertures and promote the emission of light in the forward direction. In this case, the optical element can preferably have a substrate part on which the aperture structure is applied. The lens structure can, for example, be arranged on it by means of a molding process.

The optical element 4 also has a bottom side 41 facing the foil element 3 and the semiconductor chip 1 and is at least partially applied directly to a top side 32 of the foil element 3 facing away from the semiconductor chip 1. In particular, the optical element 4 can adhere to the foil element 3 by means of adhesive forces.

Between the foil element 3 and the optical element 4 there is a gap 6 which is filled with gas. In particular, the gap 6 can be air-filled. To form the gap 6, the top side 32 of the foil element 3 and the bottom side 41 of the optical element 4 are partially spaced from each other, since the optical element 4 has a recess in the bottom side 41 which is enclosed by a frame-shaped rim. With the rim, which can be formed in one piece with the remaining part of the optical element 4 or which can also be glued or molded on, for example, the optical element 4 rests directly on the foil element 3. The gap 6 is adhesive-free due to this embodiment. The gas-filled gap 6, which in the embodiment shown is at least as wide as the light-emitting semiconductor chip 1, can improve the coupling of light from the foil element 3 into the optical element 4.

The optical element 4 is laterally surrounded by a second reflective material 5 on its side surfaces 43. The second reflective material 5 forms a molded body which covers the side surfaces 43 of the optical element 4 in a form-locking and direct manner, so that the second reflective material 5 is molded onto the optical element 4 and encloses it on all sides in the lateral direction. The second reflective material 5, which is also applied directly to the foil element 3, can also contribute in particular to the fixing of the optical element 4 to the foil element 3. The second reflective material 5 can have further features which are described above in connection with the first reflective material 2. The first and second reflective material can be the same or different. In particular, the second reflective material 5 can be a silicone filled with $TiO_2$ particles.

The second reflective material 5 has side surfaces 53 facing away from the optical element 4 in the lateral direction, which together with the side surfaces 23 of the first reflective material 2 and the side surfaces 33 of the foil element 3 form the side surfaces of the light-emitting device 100. These are preferably flat as shown in FIG. 1, so that the light-emitting device 100 can be processed in a pick-and-place process, for example.

FIGS. 2A to 2G show method steps of a method for manufacturing the light-emitting device 100 shown in FIG. 1. In particular, several light-emitting devices 100 are manufactured simultaneously in a compound process.

Figure 2A:
FIGS. 2A to 2G show schematic illustrations of method steps of a method for manufacturing a light-emitting device according to a further embodiment.
Figure 2B:
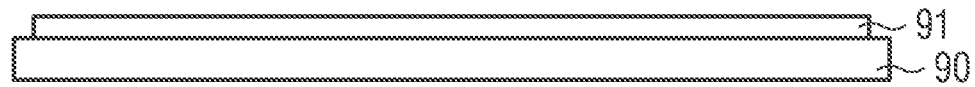

In the first method step, a temporary carrier 90 is provided, as shown in FIG. 2A. The temporary carrier 90 can be a semiconductor, metal, plastic and/or ceramic carrier, for example, in a size customary in semiconductor technology, with a diameter of 4 inches, on which a plurality of light-emitting semiconductor chips can be temporarily, i.e., non-destructively detachable again, fixed. For this purpose, as shown in FIG. 2B, a suitable adhesive film 91 can be applied to the temporary carrier 90. For example, the adhesive film 91 can be embodied as a double-sided adhesive film which is laminated onto the temporary carrier 90 and allows later non-destructive removal of devices.

Figure 2C:
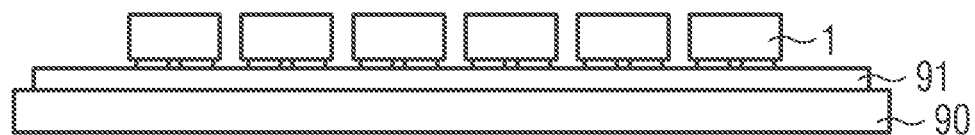

As shown in FIG. 2C, in a further method step, light-emitting semiconductor chips 100 are placed at a distance from each other on a temporary carrier 90. In particular, the light-emitting semiconductor chips 100 are applied to the carrier 90 or to the adhesive film 91 with the rear side provided with the contacts, so that the light-outcoupling surfaces of the light-emitting semiconductor chips 100 face away from the temporary carrier 90.

Figure 2D:
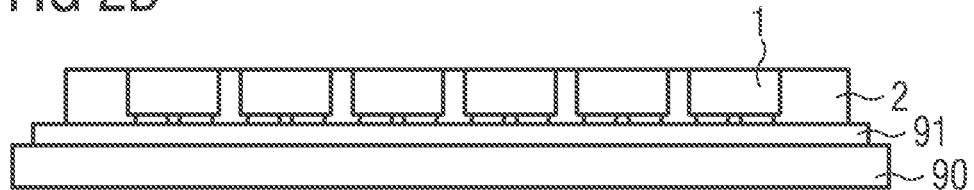

In a further method step, the semiconductor chips 100 are laterally enveloped with the first reflective material 2, as shown in FIG. 2D, so that the first reflective material 2 is laterally formed by molding onto the light-emitting semiconductor chips 100. Thus, the semiconductor chips 100 are each surrounded laterally by the first reflective material 2 in a form-locking manner. The first reflective material can comprise a silicone as a matrix material as described above, which contains particles such as $TiO_2$ particles. Furthermore, other materials described in the general part are also possible.

The first reflective material 2 can be applied by casting, injecting, pressing, or laminating a film or the like, as described in the general part. Here, the first reflective material 2 can also be applied to the rear sides of the semiconductor chips 100 in spaces between the adhesive film 91 and the semiconductor chips 100. After applying the first reflective material 2, the first reflective material is cured so that the first reflective material 2 forms a continuous body on the temporary carrier 90, in which the light-emitting semiconductor chips 100 are arranged.

Figure 2E:
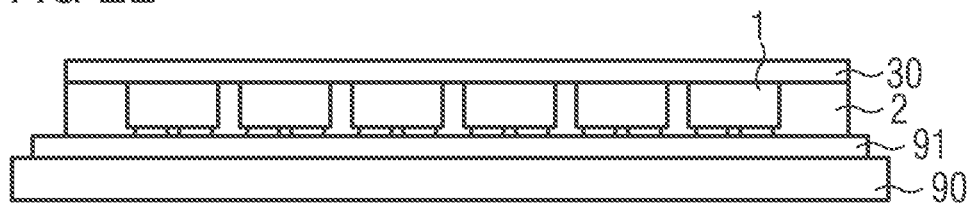

On the body thus formed, as shown in FIG. 2E, a continuous foil 30 is applied to the light-outcoupling surfaces of the light-emitting semiconductor chips 1, so that the semiconductor chips 1 together with the first reflective material 2 are covered by the continuous foil 30. The continuous foil 30 forms a compound of foil elements, so that later, after completion of the manufacturing process, a previously described foil element is arranged on each light-outcoupling surface of a semiconductor chip 1. The foil 30, which is embodied corresponding to the description above in connection with the foil element of the device in FIG. 1, is not fully cured during or after application and is tacky in this state. This allows the foil 30 to adhere to the light-emitting semiconductor chips 1 as well as to the first reflective material 2. Depending on the desired embodiment, as described above in conjunction with the foil element the foil 30 can be clearly translucent, or can also contain one or more wavelength conversion materials.

Figure 2F:
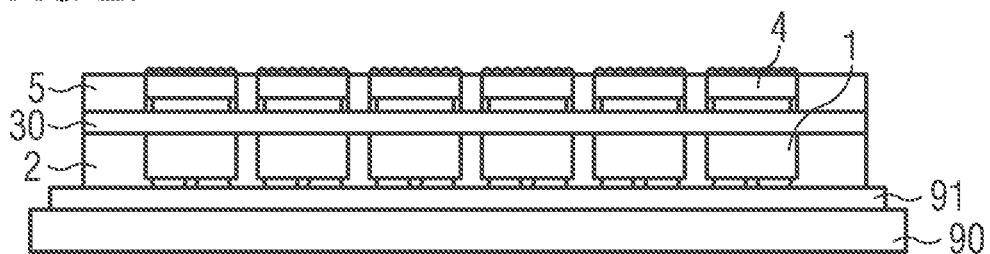

Subsequently, as shown in FIG. 2F, a plurality of optical elements 4 are applied to the foil 30, which adhere to the not yet fully cured foil 30 and can thus be fixed at least temporarily without the need to use an additional adhesive or other fixing agent. Each of the optical elements 4 is assigned to exactly one light-emitting semiconductor chip 1.

Subsequently, the optical elements 4 are laterally enveloped with the second reflective material 5 so that the second reflective material 5 surrounds each of the optical elements 4 laterally in a form-locking manner. The second reflective material 5 is preferably applied directly to the foil 30, wherein method steps and materials can be used for this purpose which are described above in connection with the first reflective material 2. Accordingly, the second reflective material 5, after application and curing, forms a continuous body on the foil 30, in which the optical elements 4 are arranged. The foil 30 can also be cured during this process.

Figure 2G:
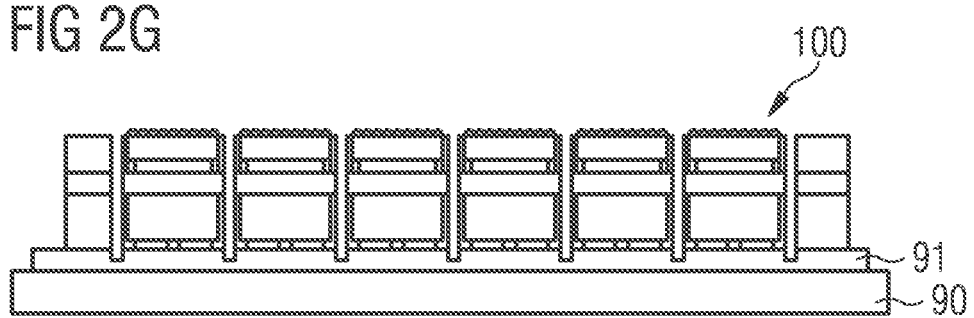

As shown in FIG. 2G, a separation is then performed to form a plurality of singulated light-emitting devices 100. In particular, the first and second reflective material 2, 5 together with the continuous foil 30 can be separated in a common sawing step. The temporary carrier 90 can have suitable markings for this purpose, for example. By the separation the laterally delimiting side surfaces the light-emitting device 100 are formed as described above in conjunction with FIG. 1, which are formed by the side surfaces of the first reflective material, of the foil element and of the second reflective material, respectively.

Subsequently, further process steps can be carried out, for example, thermal detaching of the light-emitting devices 100 from the temporary carrier 90 and/or re-lamination and plasma treatment steps such as plasma glazing to reduce the tackiness of the silicone of the first and second reflective material. In addition, the devices 100 can be tested and sorted in a film composite and then taped.

The following figures show further embodiments for light-emitting devices 100, which are modifications and further developments of the embodiment shown in FIG. 1 and which can be manufactured using the method described in conjunction with FIGS. 2A to 2G. The following description therefore mainly refers to the differences to the previous embodiments.

Figure 3:
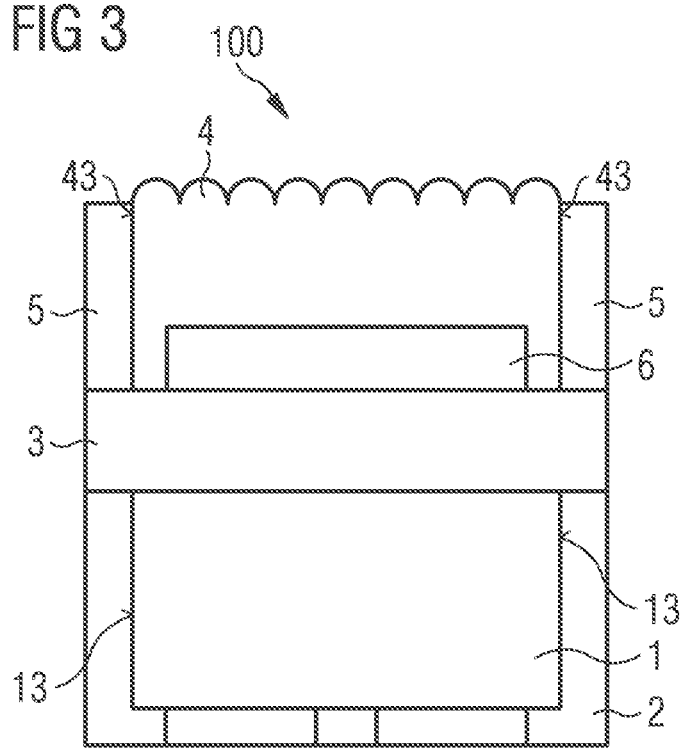
FIGS. 3 to 8 show schematic illustrations of light-emitting devices according to further embodiments.

FIG. 3 shows a further embodiment for a light-emitting device 100, in which the optical element 4 is narrower in the lateral direction compared to the embodiment in FIG. 1. As a result of the manufacturing process described above, the side walls laterally adjacent to the optical element 4 formed by the second reflective material 5 become thicker, preferably as in the case of the first reflective material 2 with a thickness greater than or equal to 200 µM, so that it can be possible to further reduce the amount of stray light emitted laterally from the second reflective material 5. Furthermore, this can result in improved light emission in the forward direction and/or improved stability.

Figure 4:
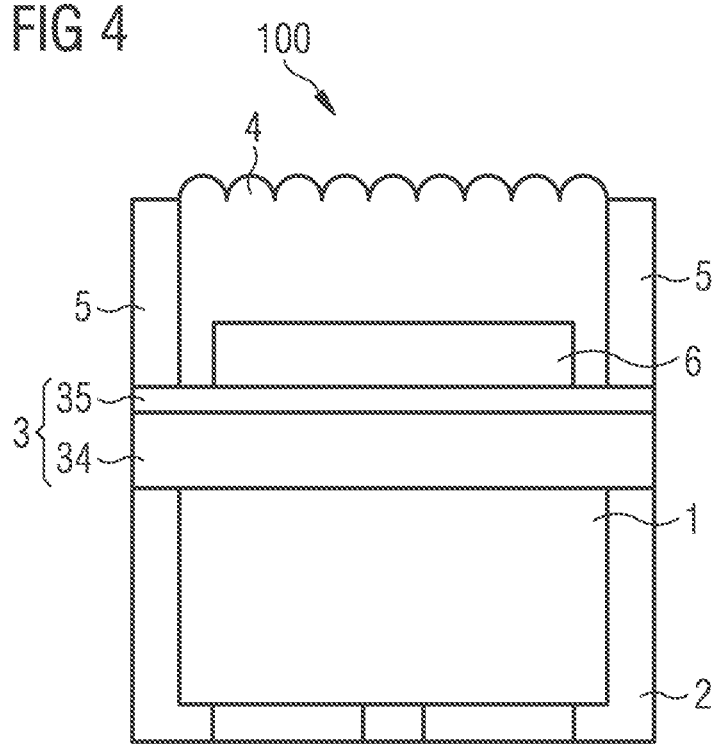

As shown in FIG. 4, the foil element 3 can have differently formed regions, especially in the form of differently formed sublayers. Two sublayers 34, 35 are shown purely as an example, of which the sublayer 34 facing the light-emitting semiconductor chip 1 comprises a wavelength conversion material, while the sublayer 35 facing the optical element 4 is free of wavelength conversion materials and thus clearly transparent. The sublayers 34, 35 can be integral parts of the foil element 3. Alternatively, the foil element 3 can be formed by a laminate of laminated foil elements formed by the sublayers 34, 35. Since it is possible that the addition of wavelength conversion materials can reduce the tackiness of the film, a sublayer free of wavelength conversion materials can be used to create a surface with increased adhesion.

Figure 5:
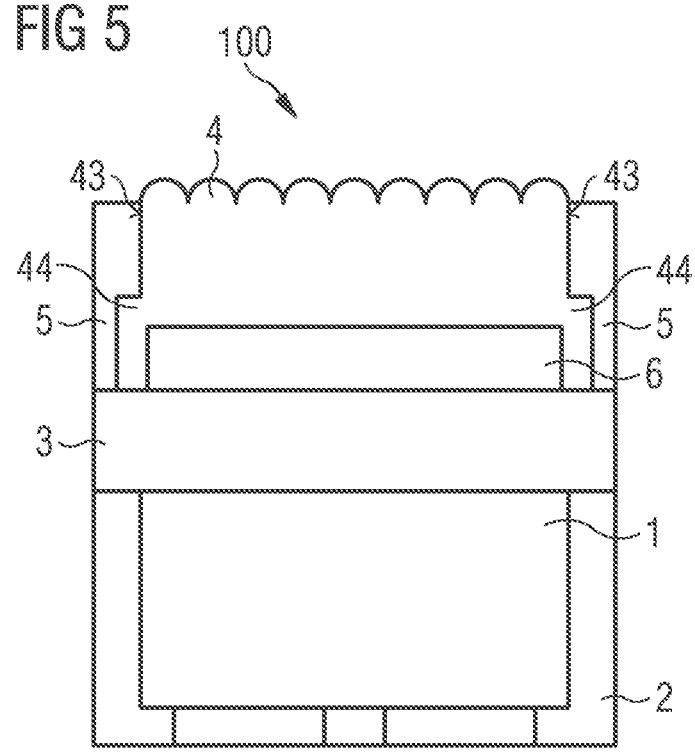

In the embodiment shown in FIG. 5, the optical element 4 has a step 44 in each of the side surfaces 43, which is covered by the second reflective material 5. The step 44 can therefore act as an anchoring element, which can improve the fastening of the optical element 4.

Figure 6:
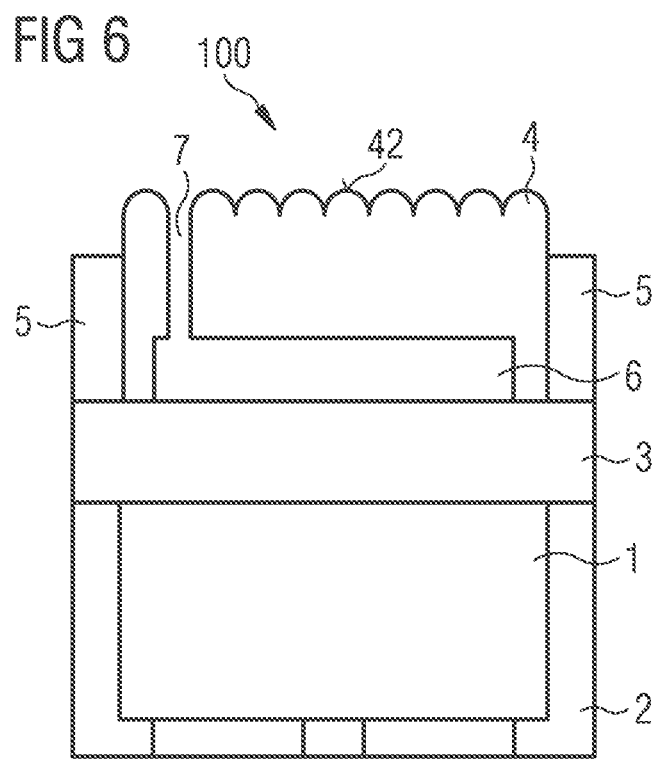
Figure 7:
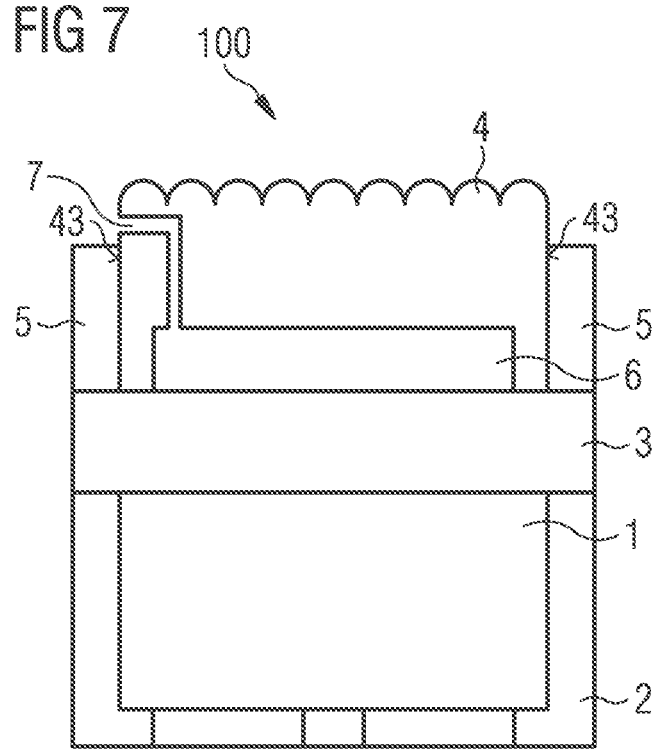
Figure 8:
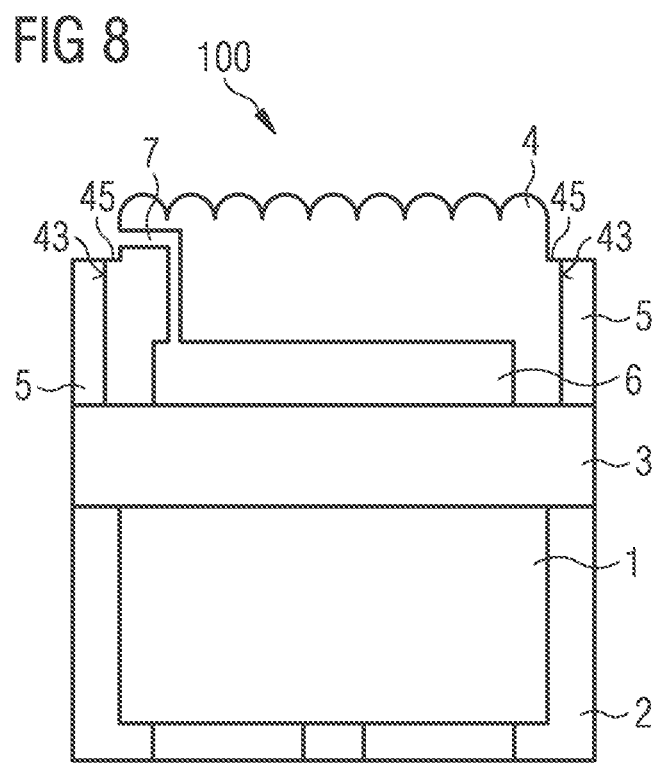

To avoid the formation of a closed microclimate in the gap 6, the optical element 4 can have a channel 7 which connects the gap 6 with the environment of the light-emitting device 100, i.e., with the atmosphere surrounding the light-emitting device 100, so that a gas and pressure exchange can take place between the environment and the gap. As shown in FIG. 6, the channel can for example, lead into the top side 42 and thus into the region of the lens structure of the optical element 4. Alternatively, the channel 7 can also lead into a side surface 43, as shown in FIGS. 7 and 8. The opening formed by the channel 7 in the side surface 43 is free of second reflective material, so that the latter can also have a corresponding opening or, as shown in FIGS. 7 and 8, ends below the opening formed by the channel 7. In order to better control the height of the second reflective material 5, it can be advantageous if the optical element 4 has a step in the side surfaces 43 embodied as a stop structure 45, which can be defined by the maximum height of the second reflective material 5.

The features and embodiments described in connection with the figures can also be combined with one another according to further embodiments, even if not all such combinations are explicitly described. Furthermore, the embodiments described in connection with the figures can have additional and/or alternative features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A light-emitting device comprising:
   a light-emitting semiconductor chip with a light-outcoupling surface surrounded laterally by a first reflective material in a form-locking manner;
   a foil element on the light-outcoupling surface;
   an optical element on the foil element laterally surrounded by a second reflective material in a form-locking manner; and
   a gas-filled gap located at least in a partial region between the foil element and the optical element,
   wherein the light-emitting device has laterally delimiting side surfaces comprising side surfaces of the first reflective material, the foil element and the second reflective material.

2. The light-emitting device according to claim 1, wherein the foil element has a top side facing away from the light-emitting semiconductor chip and the optical element has a bottom side facing the light-emitting semiconductor chip, and wherein the top side of the foil element and the bottom side of the optical element are at least partially spaced apart from one another thereby forming the gap.

3. The light-emitting device according to claim 2, wherein the optical element has a recess in the bottom side surrounded by a rim.

4. The light-emitting device according to claim 1, wherein the optical element is a lens element.

5. The light-emitting device according to claim 1, wherein the first and second reflective materials are the same.

6. The light-emitting device according to claim 1, wherein the optical element has a channel connecting the gap to an atmosphere surrounding the light-emitting device.

7. The light-emitting device according to claim 1, wherein the gap is air-filled.

8. The light-emitting device according to claim 1, wherein the light-emitting semiconductor chip is a flip chip configured to be electrically contactable on a rear side opposite the light-outcoupling surface.

9. The light-emitting device according to claim 1, wherein the foil element contains a wavelength conversion material.

10. The light-emitting device according to claim 1, wherein the foil element is transparent to light generatable by the light-emitting semiconductor chip during operation.

11. The light-emitting device according to claim 1, wherein the optical element has at least one side surface with a step or a stop structure.

12. A method for manufacturing a light-emitting device wherein the light-emitting device comprises a light-emitting semiconductor chip with a light-outcoupling surface surrounded laterally by a first reflective material in a form-locking manner, a foil element on the light-outcoupling surface, an optical element on the foil element laterally surrounded by a second reflective material in a form-locking manner and a gas-filled gap located at least in a partial region between the foil element and the optical element, the method comprising:
  providing a plurality of light-emitting semiconductor chips on a temporary carrier such that light-outcoupling surfaces of the light-emitting semiconductor chips face away from the temporary carrier;
  laterally enveloping the light-emitting semiconductor chips with the first reflective material so that the first reflective material surrounds each of the light-emitting semiconductor chips laterally in the form-locking manner;
  applying a continuous foil on the light-outcoupling surfaces of the light-emitting semiconductor chips;
  arranging a plurality of optical elements on the continuous foil;
  laterally enveloping the optical elements with the second reflective material so that the second reflective material surrounds each of the optical elements laterally in the form-locking manner; and
  separating the first and second reflective materials to form a plurality of singulated light-emitting devices.

13. The method according to claim 12, wherein the continuous foil, after applying, covers the plurality of the light-emitting semiconductor chips and the first reflective material.

14. The method according to claim 12, wherein, when the first and second reflective materials are separated, the continuous foil is also cut through to form a plurality of foil elements.

15. The method according to claim 12, wherein the continuous foil is sticky when the optical elements are applied.

16. The method according to claim 15, wherein the continuous foil is not completely cured when the optical elements are applied.

17. The method according to claim 12, wherein separating comprises sawing.

18. A light-emitting device comprising:
  a light-emitting semiconductor chip with a light-outcoupling surface surrounded laterally by a first reflective material in a form-locking manner;
  a foil element on the light-outcoupling surface;
  an optical element on the foil element laterally surrounded by a second reflective material in a form-locking manner; and
  a gas-filled gap located at least in a partial region between the foil element and the optical element,
  wherein the optical element has a channel connecting the gap to an atmosphere surrounding the light-emitting device.

19. The light-emitting device according to claim 18, wherein the optical element is a lens element.

20. The light-emitting device according to claim 18, wherein the first and second reflective materials are the same.

* * * * *